United States Patent [19]

Takechi et al.

[11] Patent Number: 5,237,275
[45] Date of Patent: Aug. 17, 1993

[54] MAGNETIC FIELD CORRECTION DEVICE

[75] Inventors: Moriaki Takechi; Toshiki Idemaru, both of Ako, Japan

[73] Assignee: Mitsubishi Denki K.K., Tokyo, Japan

[21] Appl. No.: 886,806

[22] Filed: May 22, 1992

[30] Foreign Application Priority Data

May 27, 1991 [JP] Japan ................................. 3-121005

[51] Int. Cl.⁵ ............................................. G01V 3/00
[52] U.S. Cl. ..................................... 324/320; 324/319
[58] Field of Search ............... 324/300, 307, 309, 318, 324/319, 320, 322; 335/301, 302

[56] References Cited

U.S. PATENT DOCUMENTS

| | | | |
|---|---|---|---|
| 4,639,673 | 1/1987 | Zijlstra | 324/319 |
| 4,743,853 | 5/1988 | Frese | 324/320 |
| 4,803,433 | 2/1989 | McBride | 324/318 |
| 4,990,877 | 2/1991 | Benesch | 335/301 |
| 5,047,720 | 9/1991 | Guy | 324/320 |

FOREIGN PATENT DOCUMENTS 62-193230  8/1987  Japan ................................. 324/320
08126     10/1988  PCT Int'l Appl. .
2235777    3/1991  United Kingdom .

Primary Examiner—Louis Arana
Attorney, Agent, or Firm—Sughrue, Mion, Zinn, Macpeak & Seas

[57] ABSTRACT

A magnetic field correction device for enhancing the homogeneity of a magnetic field generated by a magnet of a magnetic resonance imaging device. The correction device includes a plurality of magnetic shim holders disposed at predetermined circumferential angles on a support cylinder coaxial with the magnet. Each shim holder accommodates a magnetic shim element consisting of a first and a second magnetic bar member of distinct lengths and a first and a second non-magnetic tube for accommodating the first and second magnetic bar members therein. The members are positioned by respective stoppers inserted into the tubes.

5 Claims, 5 Drawing Sheets

MAGNETIC FIELD CORRECTION DEVICE

BACKGROUND OF THE INVENTION

This invention relates to magnetic field correction devices (i.e., passive shim arrangements) for correcting the magnetic field generated by a magnet for producing a uniform field in magnetic resonance imaging devices, etc.

Generally, the magnets for producing a uniform magnetic field are designed to generate a homogeneous field by itself. However, due to working errors and effects of iron bodies in the neighborhood, it is difficult to attain the designed level of a uniform field. Thus, a magnetic field correction device, i.e., passive shim arrangement, is provided in the magnet for compensating for the working errors and effects of the iron bodies.

FIG. 7 is a perspective view of a conventional magnetic resonance imaging device for generating a uniform magnetic field. A magnet housing accommodates a solenoid coil (not shown) for generating a homogeneous magnetic field. On top of the magnet housing 1 is provided a port 2 which incorporates terminals (not shown) for supplying excitation current to the coil. Upon receiving the current supplied via the port 2, the coil generates a homogeneous field in the magnetic field region 3 within the magnet housing 1.

A plurality of non-magnetic shim holder tubes 4 are attached to the interior surface of the support cylinder 10 disposed within the magnetic housing 1. A magnetic shim element 5 for correcting the field is inserted in each one of the non-magnetic shim holder tubes 4. Each magnetic shim element 5 consists, for example, of a pair of magnetic bars of distinct lengths soldered to each other. The two ends of the non-magnetic shim holder tubes 4 are sealed by the stoppers 6. The magnetic field correction device consists of the non-magnetic shim holder tubes 4, the magnetic shim elements 5 and the stoppers 6.

Next the operation of the device of FIG. 7 is described. FIG. 8 is a perspective view of a single magnetic bar, two of which of distinct lengths are soldered to each other to form a magnetic shim element. The bar is axially aligned with the Z-axis. The magnetization of the magnetic bar 11 is saturated by means of the external magnetic field 12 along the Z-axis. As a result, magnetic charges appear at the end surfaces 11a and 11b, such that a correction field 13 opposite to the external magnetic field 12 is generated. The magnetic shim elements 5 each consisting of two magnetic bars 11 of appropriate dimensions thus obtained are disposed at appropriate positions upon the interior surface of the support cylinder 10 within the bore of the magnet housing 1, such that the non-homogeneity of the magnetic field within the magnetic field region 3 is corrected.

Next, the details of the correction of the magnetic field are described. FIG. 9 is a schematic axial sectional view of a single magnetic bar, showing the positional relation between the magnetic bar and the measurement point in the Z-Y plane. (The Z-axis agrees with the axis of the support cylinder 10 and the field generating cylinder, and the origin is at the center of the magnetic field region 3.) FIG. 10 is a schematic end view of a single magnetic bar, showing the positional relation between the magnetic bar and the measurement point in the X-Y plane (the plane passing the origin and perpendicular to the Z-axis). The magnetic bar 11 is disposed parallel to the Z-axis at a circumferential attachment angle $\phi$ and an attachment radius a (see FIG. 10) such that the end surfaces of the magnetic bar 11 form end angles $\alpha_1$, $\alpha_2$ with respect to the origin and the Z-axis (see FIG. 9). The measurement point P is positioned at a radius r which forms an angle $\phi$ with respect to the X-axis (see FIG. 10) and angle $\phi$ with respect to the Z-axis (see FIG. 9).

Then, the magnetic field $B_z$ formed by the magnetic bar 11 at measurement point P is given by equation (1):

$$B_z^{nm} = -K(1/A^2) \sum_{n=0}^{\infty} \sum_{m=0}^{n} \epsilon_m \frac{(n-m+1)!}{(n+m)!} [P_{n+1m}(\cos\alpha)\sin^{n+2}\alpha]_{\alpha_1}^{\alpha_2} \times (r/a)^n P_n^m(\cos\theta) \times \cos m(\Phi - \phi) \quad (1)$$

where K is a constant determined by the magnetic characteristic of the magnetic shim element 5, A is the cross-sectional area of the magnetic bar 11, $\epsilon_m$ is the Neumann coefficient ($\epsilon_m = 2$ if $m \neq 0$ and $\epsilon_m = 1$ if $m=0$), and $P_n^m$ is the associated Legendre polynomial of degree n and order m.

Further, the following table 1 shows the output components of the magnetic field in the spherical polar coordinates $B_z^{nm}$ (up to n=2) together with the components expressed in the orthogonal coordinate system X, Y, Z.

TABLE 1

(CORRESPONDENCE UP TO n = 2)

| n | m | COMPONENTS IN ORTHOGONAL COORDINATES |
|---|---|---|
| 1 | 0 | Z |
| 1 | 1 | X or Y |
| 2 | 0 | $Z^2$ |
| 2 | 1 | ZX or ZY |
| 2 | 2 | $X^2 - Y^2$ or XY |

Next, the magnetic field correction generating a negative X component with respect to the orthogonal coordinate system is described. As shown in equation (1), the number of the magnetic components generated by the magnetic bar 11 is infinite. However, since generally $a > r$ holds, the factor: $(r/a)^n$ becomes negligibly small for those terms for which the value of n is great. Thus, it suffices to determine the dimensions and positions of the magnetic bars 11 which generate only the $B_z^{11}$ corresponding to the X-component among those components for which the values of n and m are small: $B_z^{11}$, $B_z^{21}$, $B_z^{22}$, $B_z^{31}$, $B_z^{32}$, $B_z^{33}$, $B_z^{41}$, $B_z^{42}$, $B_z^{43}$, $B_z^{44}$, $B_z^{51}$, $B_z^{52}$, $B_z^{53}$, $B_z^{54}$. This is effected as described below in (i), (ii), and (iii).

(i) The circumferential attachment angle $\phi$ of the magnetic bar 11 is determined as given by equations (2) through (9):

$$\phi = (\pi/2)((\tfrac{1}{2}) + (\tfrac{1}{2}) + (\tfrac{1}{2})) \quad (2)$$

$$\phi = (\pi/2)((\tfrac{1}{2}) + (\tfrac{1}{2}) - (\tfrac{1}{2})) \quad (3)$$

$$\phi = (\pi/2)((\tfrac{1}{2}) - (\tfrac{1}{2}) + (\tfrac{1}{2})) \quad (4)$$

$$\phi = (\pi/2)((\tfrac{1}{2}) - (\tfrac{1}{2}) - (\tfrac{1}{2})) \quad (5)$$

$$\phi = (\pi/2)(-(\tfrac{1}{2}) + (\tfrac{1}{2}) + (\tfrac{1}{2})) \quad (6)$$

$$\phi = (\pi/2)(-(\tfrac{1}{2}) + (\tfrac{1}{2}) - (\tfrac{1}{2})) \quad (7)$$

$$\phi = (\pi/2)(-(\tfrac{1}{2})-(\tfrac{1}{2})+(\tfrac{1}{2})) \quad (8)$$

$$\phi = (\pi/2)(-(\tfrac{1}{2})-(\tfrac{1}{2})-(\tfrac{1}{2})) \quad (9)$$

such that the factor: $\cos m(\Phi - \phi)$ for $m = 2, 3, 4$ vanishes and thus the components: $B_z^{22}$, $B_z^{32}$, $B_z^{33}$, $B_z^{42}$, $B_z^{43}$, $B_z^{44}$, $B_z^{52}$, $B_z^{53}$, and $B_z^{54}$ vanish. On the other hand, the component $B_z^{11}$ corresponding to negative X-component is generated.

(ii) The end angles $\alpha_1$, $\alpha_2$ of each magnetic bar 11 are selected such that they satisfy: $\alpha_2 = \pi - \alpha_1$. Then, the following equations (10) and (11) hold and the components $B_z^{21}$ and $B_z^{41}$ vanish:

$$[P_3^1(\cos\alpha)\sin^4\alpha]_{\pi-\alpha}^{\alpha} = 0 \quad (10)$$

$$[P_5^1(\cos\alpha)\sin^6\alpha]_{\pi-\alpha}^{\alpha} = 0 \quad (11)$$

Further, by selecting the end angles $\alpha_1$, $\alpha_2$ of the two magnetic bars 11 at 33.88° and 146.12°, respectively, or at 62.04° and 117.96°, respectively, the components $B_z^{51}$ of the two magnetic bars are both eliminated.

(iii) If the cross-sectional area of the magnetic bar 11 having end angles $\alpha_1$, $\alpha_2$ at 33.88° and 146.12° respectively, and that of the magnetic bar 11 having end angles $\alpha_1$, $\alpha_2$ at 62.04° and 117.96° respectively, are represented by $A_1$ and $A_2$, respectively, then the resultant component $B_z^{31}$ of the two magnetic bars 11 is given by:

$$B_z^{31} \propto A_1\{P_4^1(\cos 33.88°)(\sin 33.88°)^5\} + A_2\{P_4^1(\cos 62.04°)(\sin 62.04°)^5\} \quad (12)$$

Thus, by selecting the ratio $A_1/A_2$ at 7.16 as shown by the following equation (13), the component $B_z^{31}$ vanishes.

$$\frac{A_1}{A_2} = \frac{\{P_4^1(\cos 33.88°)(\sin 33.88°)^5\}}{\{P_4^1(\cos 62.04°)(\sin 62.04°)^5\}} = 7.16 \quad (13)$$

The position of the magnetic bar 11 and the ratio of the cross-sectional areas $A_1/A_2$ of the two magnetic bars 11 are selected as described above in (i), (ii), and (iii) such that the components other than the desired component $B_z^{11}$ are eliminated.

The two magnetic bars 11 whose dimension and position are determined as described above are secured to each other by means of solder 14, etc., such that the relative axial position of the two bars is fixed. The two bars 11 thus secured to each other constitutes a magnetic shim element 5. Further, predetermined number of magnetic shim elements 5 are inserted into respective non-magnetic shim holder tubes 4 disposed at the attachment angle $\phi$ as determined by equations (2) through (9) in (i) above, and the homogeneity of the X-component of the magnetic field is thereby adjusted. By the way, the cross-sectional areas of the magnetic bars 11 are varied in accordance with the magnitude of the necessary field correction, although the ratio of the cross sectional areas of the two magnetic bars 11 is maintained at the value as determined in (iii).

The above field correction device still has the following disadvantage. The two magnetic bars 11 must first be secured to each other by means, for example, of the solder 14. This requires time and labor. Further, when a plurality of magnetic shim elements 5 are inserted into a non-magnetic shim holder tube 4, the shorter magnetic bar 11 of the firstly inserted magnetic shim element 5 obstructs the smooth entrance of the secondly inserted magnetic shim element 5. This increases the time and labor required for the insertion of the magnetic shim element 5 into the non-magnetic shim holder tubes 4.

SUMMARY OF THE INVENTION

It is therefore an object of this invention to provide a magnetic field correction device by which magnetic bars of distinct lengths can be precisely positioned without first securing them to each other such that the assembling step is simplified.

The above object is accomplished in accordance with the principle of this invention by a magnetic field correction device for enhancing a uniformity of a magnetic field generated in a magnetic field region by a magnetic field generating device, which comprises a plurality of parallel shim holders disposed at a common radius from a center of the magnetic field region, wherein each shim holder includes a first and a second parallel non-magnetic tubes disposed adjacent to each other; a plurality of magnetic shim elements accommodated in the shim holders, wherein each magnetic shim element includes a first and a second magnetic bar member of predetermined distinct lengths inserted into the first and second non-magnetic tubes, respectively; and axial positioning means for positioning the first and second magnetic bar members within the first and second non-magnetic tubes, respectively, such that axial displacements of the first and second magnetic bar members within the first and second non-magnetic tubes, respectively, are prevented.

Preferably, the shim holders are disposed at predetermined circumferential angular positions on a cylinder having an axis passing through the center of the magnetic field region, such that predetermined magnetic field components generated by the first and second magnetic bar members vanish. Further, it is preferred that the stoppers inserted into the first and second non-magnetic tubes determine axial positions of the first and second magnetic bar members. Furthermore, it is preferred that the first and second magnetic bar members inserted into the first and second non-magnetic tubes and axially positioned by the axially positioning means form predetermined end angles with respect to a center of the magnetic field region, such that predetermined magnetic field components generated by the first and second magnetic bar members vanish. Still further, it is preferred that the first and second magnetic bar members have predetermined ratio of cross-sectional areas such that a predetermined magnetic field component generated by the first and second magnetic bar members vanishes.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

In the drawings, like reference numerals represent like or corresponding parts or portions.

DETAILED DESCRIPTION OF THE PREFERRED EMBODIMENT

Referring now to the accompanying drawings, the preferred embodiment of this invention is described. In the case of this embodiment, the negative X component of the magnetic field is corrected.

Figure 1:
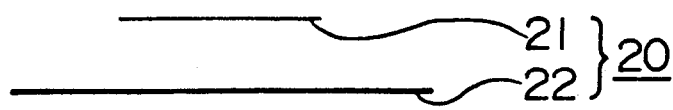
FIG. 1 is a schematic side view of a magnetic shim element of a magnetic field correction device according to an embodiment of this invention.

FIG. 1 is a schematic side view of a magnetic shim element of a magnetic field correction device according to an embodiment of this invention. A magnetic shim element consists of a first magnetic bar member 21 and a second magnetic bar member 22 of distinct lengths, which are cut to respective predetermined lengths from respective magnetic bars of predetermined cross-sectional area.

Figure 2:
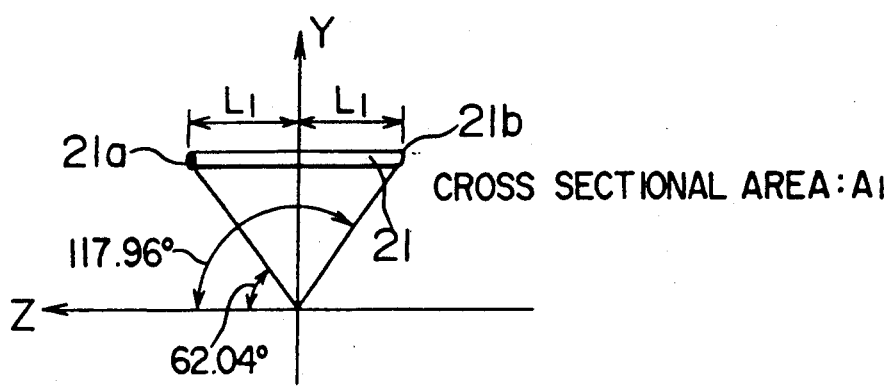
FIG. 2 is a schematic side view of a first magnetic bar member, showing the dimensional and positional parameters thereof.

FIG. 2 is a schematic side view of a first magnetic bar member, showing the dimensional and positional parameters thereof. The length $L_1$ of the first magnetic bar member 21 is determined such that the end surfaces 21a and 21b thereof form end angles $\alpha_1$, $\alpha_2$ of 62.04° and 117.96° at a radius a from the origin (the center of the magnetic field region).

Figure 3:
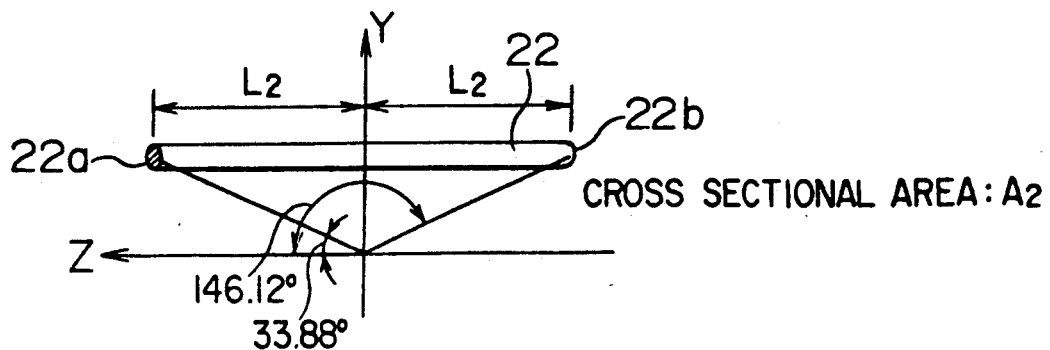
FIG. 3 is a schematic side view of a second magnetic bar member, showing the dimensional and positional parameters thereof.

FIG. 3 is a schematic side view of a second magnetic bar member, showing the dimensional and positional parameters thereof. The length $L_2$ of the second magnetic bar member 22 is determined such that the end surfaces 22a and 22b thereof form end angles $\alpha_1$, $\alpha_2$ of 33.88° and 146.12° at a radius a from the origin (the center of the magnetic field region).

The cross sectional area $A_1$ of the first magnetic bar member 21 and that $A_2$ of the second magnetic bar member 22 are selected such that the ratio of the cross sectional areas of the first magnetic bar member 21 and the second magnetic bar member 22 is substantially at 7.16.

Figure 4:
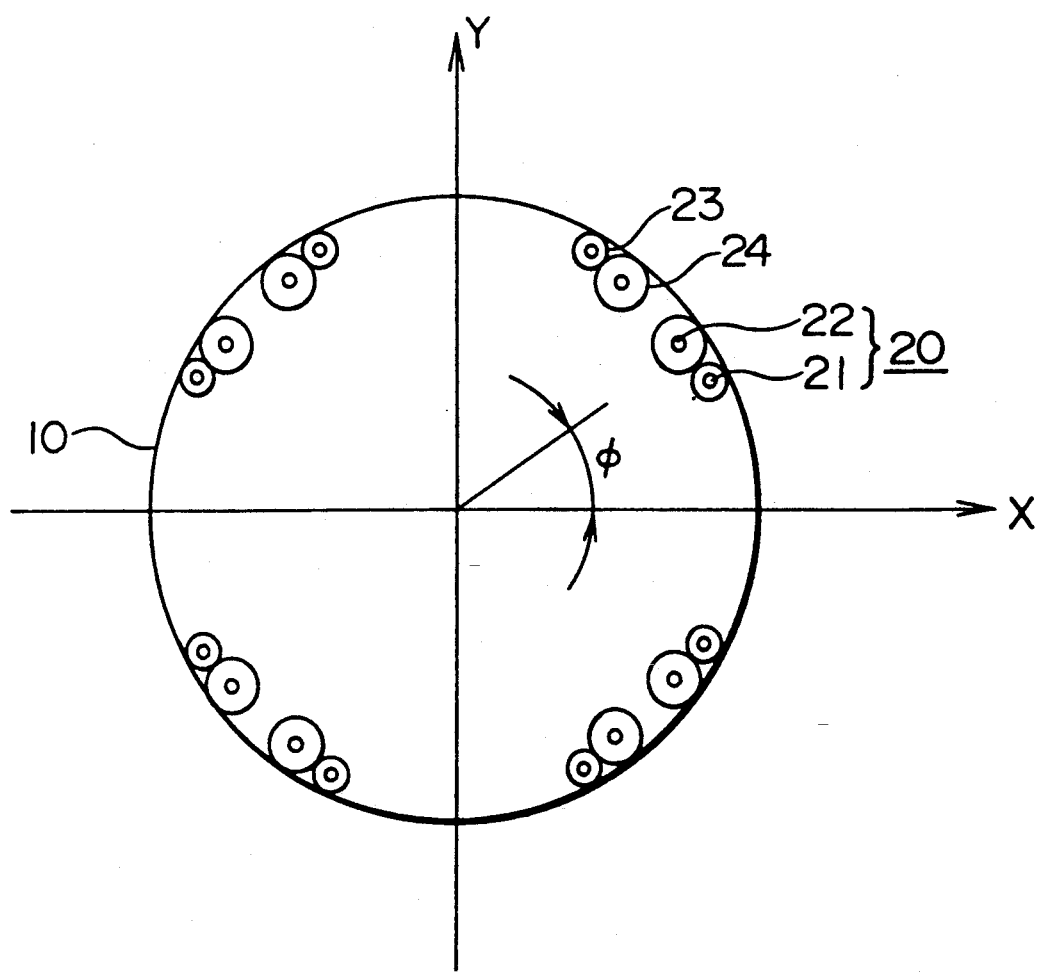
FIG. 4 is a schematic end view of the magnetic field correction device, showing the circumferential angular positions of the shim holders and the magnetic shim elements inserted therein.
Figure 5:
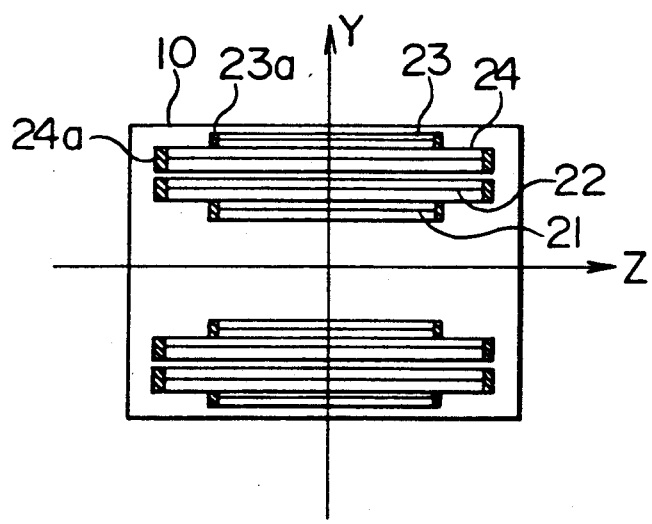
FIG. 5 is a schematic axial sectional view of the magnetic field correction device.

FIG. 4 is a schematic end view of the magnetic field correction device, showing the circumferential angular positions of the shim holders and the magnetic shim elements inserted therein. FIG. 5 is a schematic axial sectional view of the magnetic field correction device. The support cylinder 10 is disposed coaxially within a field generating magnet. The Z-axis is the axis of the magnet and the support cylinder 10, and the origin is at the center of the magnetic field region.

Eight shim holders, each consisting of a first non-magnetic tube 23 accommodating the first magnetic bar member 21 and a second non-magnetic tube 24 accommodating the second magnetic bar member 22, are attached on the inner surface of the support cylinder 10 at a radius a from the origin at circumferential angular positions as determined by the equations (2) through (9). The first non-magnetic tube 23 and the second non-magnetic tube 24 are disposed parallel to the Z-axis and adjacent to each other. The first non-magnetic tube 23 and the second non-magnetic tube 24 have lengths corresponding to the respective lengths of the first magnetic bar member 21 and the second magnetic bar member 22 inserted therein. Further, as shown in FIG. 5, the first magnetic bar member 21 and the second magnetic bar member 22 are axially positioned within the first non-magnetic tube 23 and the second non-magnetic tube 24 by means of the stoppers 23a and the stoppers 24a, respectively, such that the axial displacements of the first magnetic bar member 21 and the second magnetic bar member 22 are prevented. The relative axial positions of the first non-magnetic tube 23 and second non-magnetic tube 24 are determined such that the first magnetic bar member 21 and the second magnetic bar member 22 are at predetermined relative axial positions.

Next, the operation of the magnetic field correction device according to this invention is described. The eight shim holders, each consisting of the first non-magnetic tube 23 and the second non-magnetic tube 24, and therefore the eight magnetic shim element 20, each consisting of the first magnetic bar member 21 and the second magnetic bar member 22, are attached at respective circumferential positions as determined by the equations (1) through (9). Thus, the end angles $\alpha_1$, $\alpha_2$ of the second magnetic bar member 22 are 33.88° and 146.12°, respectively, and the end angles $\alpha_1$, $\alpha_2$ of the first magnetic bar member 21 are 62.04° and 117.96°, respectively. Further, the ratio of the cross-sectional areas of the second magnetic bar member 22 and the first magnetic bar member 21 is selected at 7.16. Thus, as described in detail in the introductory portion of this specification, the magnetic field correction device effects the magnetic field correction of only the selected component, the X-component in the case of this embodiment, generating only the negative X-component field.

Since the first magnetic bar member 21 and the second magnetic bar member 22 of each magnetic shim element 20 are not secured to each other and the relative axial positions thereof is determined by the relative axial positions of the first non-magnetic tube 23 and the second non-magnetic tube 24, the step of soldering the first magnetic bar member 21 and the second magnetic bar member 22 to each other becomes unnecessary and the insertion of the first magnetic bar member 21 and the second magnetic bar member 22 into the first non-magnetic tube 23 and the second non-magnetic tube 24, respectively, is facilitated.

The above embodiment corrects the X-component of the magnetic field generated by a magnet. However, this invention can be applied to magnetic field correction devices for correcting other components. For example, if the circumferential attachment positions of the shim holders and the magnetic shim element 20 are circumferentially shifted by 90 degrees, the Y-component can be corrected.

Figure 6:
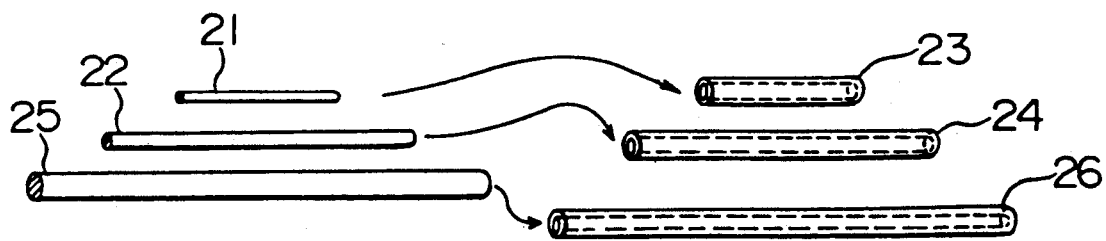
FIG. 6 is a perspective view of the non-magnetic shim holder tubes and the magnetic bars of three distinct lengths of a magnetic field correction device according to another embodiment of this invention.
Figure 7:
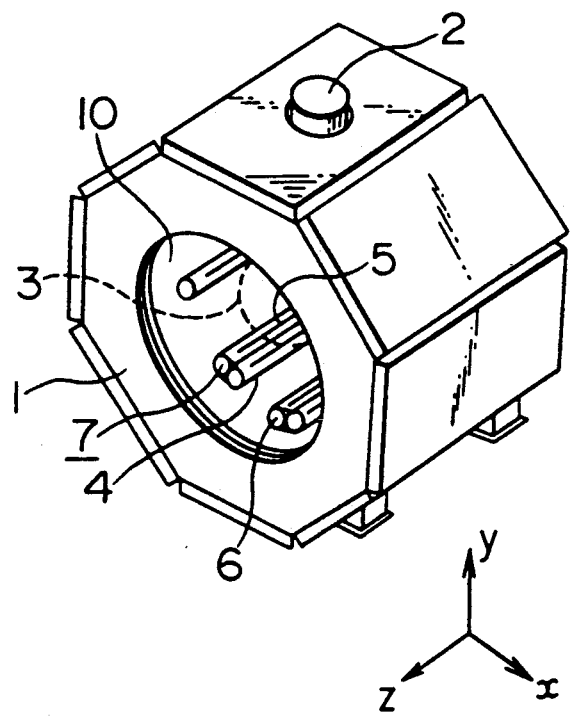
FIG. 7 is a perspective view of a conventional imaging device for generating uniform magnetic field.
Figure 8:
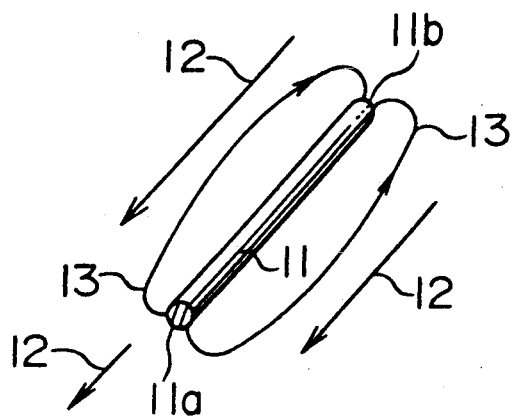
FIG. 8 is a perspective view of a single magnetic bar, the two of which of distinct lengths are soldered to each other to form a magnetic shim element.
Figure 9:
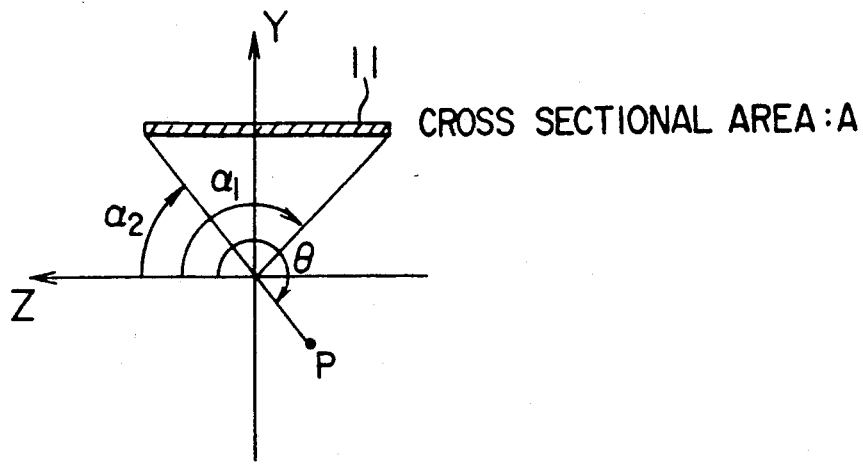
FIG. 9 is a schematic axial sectional view of a single magnetic bar, showing the positional relation between the magnetic bar and the measurement point in the Z-Y plane.
Figure 10:
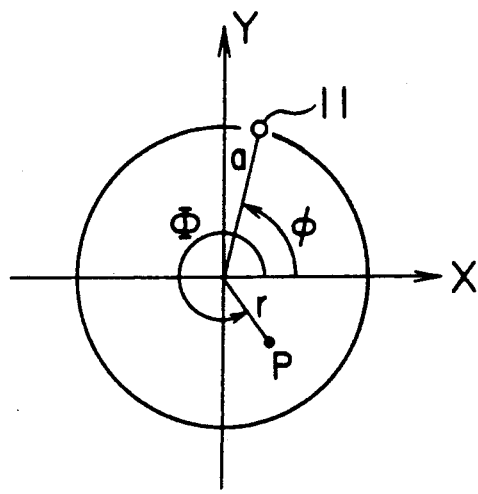
FIG. 10 is a schematic end view of a single magnetic bar, showing the positional relation between the magnetic bar and the measurement point in the X-Y plane.
Figure 11:
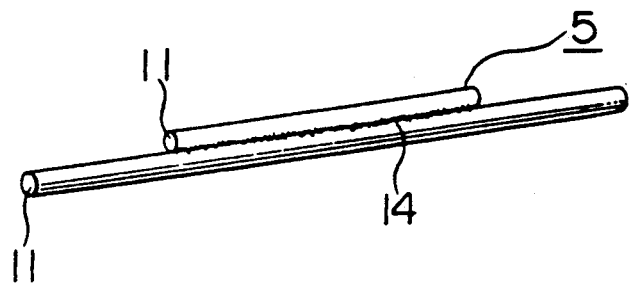
FIG. 11 is a perspective view of a magnetic shim element soldered to each other.

FIG. 6 is a perspective view of the non-magnetic shim holder tubes and the magnetic bars of three distinct lengths of a magnetic field correction device according to another embodiment of this invention. In the case of the embodiment of FIG. 6, each magnetic shim element 20 consists of a first, a second, a third magnetic bar member 21, 22, 25, inserted respectively into a first, a second and a third non-magnetic tube 23, 24, and 26. Shim holders, each consisting of these three parallel and adjacent tubes 23, 24, and 26, are attached to a support cylinder at predetermined circumferential locations. Furthermore, each magnetic shim element may consist of four or more magnetic bar members, each inserted into respective non-magnetic tubes constituting a shim holder. It is also noted that the number and positions of the magnetic shim elements are not limited to those specified above.

Furthermore, in the case of the above embodiment, the first non-magnetic tube 23 and the second non-magnetic tube 24 have distinct lengths corresponding to the lengths of the first magnetic bar member 21 and the second magnetic bar member 22. However, the first non-magnetic tube 23 and the second non-magnetic tube 24 may have the same length, the axial position of the first magnetic bar member 21 being determined by stoppers disposed at a predetermined axial position within the first non-magnetic tube 23. Further, although the above magnetic field correction device corrects the magnetic field of a magnetic resonance imaging device, the magnetic field correction device according to this invention may be applied to other magnetic field generating devices as well.

What is claimed is:

1. A magnetic field correction device for enhancing the uniformity of a magnetic field generated in a magnetic field region by a magnetic field generating device, comprising:

a plurality of parallel shim holders disposed at a common radius from a center of said magnetic field region, wherein each shim holder includes first and second parallel non-magnetic tubes disposed adjacent to and in contact with each other;

a plurality of magnetic shim elements accommodated in said shim holders, wherein each magnetic shim element includes a first and a second magnetic bar member each of a predetermined distinct length inserted into said first and second non-magnetic tubes, respectively, said first and second non-magnetic tubes each having a length respectively corresponding to the predetermined distinct length of said first and second magnetic bar members; and axial positioning means for positioning said first and second magnetic bar members within said first and second non-magnetic tubes, respectively, and preventing axial displacements of said first and second magnetic bar members within said first and second non-magnetic tubes, respectively.

2. A magnetic field correction device as claimed in claim 1, wherein said shim holders are disposed at predetermined circumferential angular positions on a cylinder having an axis passing through said center of said magnetic field region for removing predetermined magnetic field components generated by said first and second magnetic bar members.

3. A magnetic field correction device as claimed in claim 1, wherein said axial positioning means comprises stoppers inserted into said first and second non-magnetic tubes for fixing the axial positions of said first and second magnetic bar members in predetermined positions.

4. A magnetic field correction device as claimed in claim 1, wherein said first and second magnetic bar members inserted into said first and second non-magnetic tubes and axially positioned by said axially positioning means form predetermined end angles with respect to a center of said magnetic field region for removing predetermined magnetic field components generated by said first and second magnetic bar members.

5. A magnetic field correction device as claimed in claim 1, wherein said first and second magnetic bar members have predetermined ratio of cross-sectional areas for removing a predetermined magnetic field component generated by said first and second magnetic bar members.

* * * * *